(12) United States Patent
Perez-Uria et al.

(10) Patent No.: US 10,617,007 B2
(45) Date of Patent: Apr. 7, 2020

(54) PRINTED CIRCUIT BOARD, A TERMINAL AND A METHOD OF ASSEMBLING A PRINTED CIRCUIT BOARD MODULE

(71) Applicant: Telefonaktiebolaget LM Ericsson (publ), Stockholm (SE)

(72) Inventors: Igor Perez-Uria, Järfälla (SE); Lars Drugge, Stockholm (SE); Per Ferm, Täby (SE); Enock Huang, Shanghai (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/085,340

(22) PCT Filed: Mar. 17, 2016

(86) PCT No.: PCT/SE2016/050223
§ 371 (c)(1),
(2) Date: Sep. 14, 2018

(87) PCT Pub. No.: WO2017/160198
PCT Pub. Date: Sep. 21, 2017

(65) Prior Publication Data
US 2019/0090349 A1     Mar. 21, 2019

(51) Int. Cl.
*H05K 1/18*     (2006.01)
*H05K 1/14*     (2006.01)
(Continued)

(52) U.S. Cl.
CPC ............ *H05K 1/181* (2013.01); *H01R 12/57* (2013.01); *H05K 1/0203* (2013.01); *H05K 1/111* (2013.01);
(Continued)

(58) Field of Classification Search
CPC ........ H01R 12/57; H05K 1/111; H05K 1/117; H05K 2201/041; H05K 2201/10303; H05K 2201/1034; H05K 3/3405
See application file for complete search history.

(56) References Cited

U.S. PATENT DOCUMENTS 3,599,234 A * 8/1971 Andreini .............. H01R 13/518
                                                   361/802
3,780,433 A * 12/1973 Lynch .................... H01R 12/58
                                                    29/843

(Continued)

FOREIGN PATENT DOCUMENTS

DE        44 25 803 A1     2/1995
DE        295 20 159 U1    2/1996
(Continued)

OTHER PUBLICATIONS

International Search Report and Written Opinion issued in International Application No. PCT/EP2016/050223, dated Dec. 19, 2016, 10 pages.

*Primary Examiner* — William H. Mayo, III
*Assistant Examiner* — Rhadames Alonzo Miller
(74) *Attorney, Agent, or Firm* — Sage Patent Group (57) ABSTRACT

Embodiments herein relate to a Printed Circuit Board, PCB, (1) and a terminal (2) for connecting the PCB (1) to an electrical component. The PCB (1) comprises a through-hole (11) for receiving the terminal (2). The through-hole (11) has a partially open side wall (12), wherein the side wall (12) is open along at least a part of a length (L) of the 5 through-hole (11) perpendicular to a radius (R) of the through-hole (11). This allows the terminal (2) to protrude through the open side wall (12) when received by the through-hole (11), such that a position of the terminal (2) is adjustable along the length of the open side wall (12). The terminal (2) comprises a base (21), adapted to be received by
(Continued)

the through-hole (11) of the PCB (1) and to create a press fit with the side wall (12) of the through-hole 10 (11), and a pin (22) projecting from a surface (23) of the base (21). The pin (22) is adapted to protrude through the open side wall (12), when the base (21) is inserted into the through-hole (11) of the PCB (1). Furthermore, embodiments herein relate to a method for assembling a PCB module (120) comprising the terminal (2) and the PCB (1).

15 Claims, 11 Drawing Sheets (51) Int. Cl.
  *H01R 12/57* (2011.01)
  *H05K 1/02* (2006.01)
  *H05K 1/11* (2006.01)
  *H05K 3/34* (2006.01)
  *H05K 3/40* (2006.01)
  *H05K 3/36* (2006.01)
(52) U.S. Cl.
  CPC .......... *H05K 1/141* (2013.01); *H05K 3/3405* (2013.01); *H05K 3/403* (2013.01); *H05K 1/117* (2013.01); *H05K 3/366* (2013.01); *H05K 3/368* (2013.01); *H05K 2201/041* (2013.01); *H05K 2201/044* (2013.01); *H05K 2201/09063* (2013.01); *H05K 2201/09145* (2013.01); *H05K 2201/09181* (2013.01); *H05K 2201/1034* (2013.01); *H05K 2201/10303* (2013.01)

(56) References Cited

U.S. PATENT DOCUMENTS

| | | | | | |
|---|---|---|---|---|---|
| 3,864,014 | A | * | 2/1975 | Lynch | H01R 12/58 439/389 |
| 4,436,358 | A | * | 3/1984 | Coldren | H01R 12/58 439/742 |
| 4,697,864 | A | * | 10/1987 | Hayes | H01R 12/724 439/444 |
| 4,767,350 | A | * | 8/1988 | Cooper | H01R 12/716 439/271 |
| 4,872,846 | A | * | 10/1989 | Clark | H01R 4/02 439/83 |
| 5,446,624 | A | * | 8/1995 | Saito | G01R 1/07307 174/261 |
| 5,463,532 | A | * | 10/1995 | Petitpierre | H05K 9/0016 174/355 |
| 5,491,613 | A | * | 2/1996 | Petitpierre | H05K 7/1409 174/355 |
| 5,554,037 | A | * | 9/1996 | Uleski | H01H 19/585 439/741 |
| 6,166,464 | A | * | 12/2000 | Grant | H01L 25/16 310/68 D |
| 6,271,480 | B1 | * | 8/2001 | Yamaguti | H01L 23/32 174/260 |
| 6,447,305 | B1 | * | 9/2002 | Roberts | H01R 12/774 439/260 |
| 6,545,890 | B2 | * | 4/2003 | Pitzele | H05K 3/3447 29/852 |
| 6,628,860 | B1 | * | 9/2003 | Van Doorn | G02B 6/423 385/31 |
| 6,773,269 | B1 | * | 8/2004 | Downes | H05K 3/368 439/55 |
| 9,585,263 | B2 | * | 2/2017 | Matoy | H05K 3/325 |
| 2002/0029904 | A1 | * | 3/2002 | Matuschik | H01R 12/57 174/263 |
| 2005/0079766 | A1 | * | 4/2005 | Ho | H01R 12/721 439/630 |
| 2006/0189199 | A1 | * | 8/2006 | Lang | H01R 12/7005 439/374 |
| 2010/0253155 | A1 | * | 10/2010 | Lu | H05K 1/141 307/147 |
| 2011/0116236 | A1 | * | 5/2011 | Akahori | H05K 1/141 361/704 |
| 2014/0369017 | A1 | * | 12/2014 | Jeanneteau | H05K 1/14 361/803 |
| 2018/0109026 | A1 | * | 4/2018 | Kurumaddali | H01R 13/2421 |

FOREIGN PATENT DOCUMENTS

GB   1 241 234 A   8/1971
WO   2015/090410 A1   6/2015

* cited by examiner

PRINTED CIRCUIT BOARD, A TERMINAL AND A METHOD OF ASSEMBLING A PRINTED CIRCUIT BOARD MODULE

CROSS REFERENCE TO RELATED APPLICATION(S)

This application is a 35 U.S.C. § 371 National Stage of International Patent Application No. PCT/SE2016/050223, filed Mar. 17, 2016, designating the United States, the disclosure of which is incorporated by reference.

TECHNICAL FIELD

Embodiments herein relate to a Printed Circuit Board (PCB) and a terminal for connecting the PCB to an electrical component. Furthermore, a method for assembling a PCB module comprising the terminal and the PCB is provided herein.

BACKGROUND

Modern electronic devices, such as telecom equipment, often comprise a large number of electronic packages comprising Printed Circuit Boards (PCBs) with different types of electronic components in order to provide desired functionality of the electronic devices. These electronic packages may also be referred to as PCB modules.

When integrating the PCB modules and their functions there are different requirements that have to be addressed, such as e.g. a required number of signal communication busses and a current distribution in the PCB.

In power electronics, such as DC-DC converters, the PCBs often carry high currents. Dimensions of power components required to carry these high currents often set a constraint on an overall height of the PCB modules. The high power densities needed in the power components of the PCB module further require an efficient cooling of the power components. A thermal loss distribution of the electronic packages is typically managed by a heat spreader, such as a base plate made of a high thermo-conductive material, such as e.g. aluminium-plates and/or heat sinks, connected to an active and/or passive cooling reference within an enclosure. The enclosure may e.g. be a chassis of the electronic device and/or air surrounding the components.

In order to harmonize the requirements discussed above and to provide the desired functionality of the electronic device, a plurality of different mechanical variants and options of power modules are usually provided. This result in high manufacturing costs and a complex supply chain for involved components. Furthermore, a plurality of PCB modules is usually placed next to each other on a host board in an enclosure to form the electronic device. Due to the plurality of different variants of the power modules the dimensions of the PCB modules may vary. In order to be able to package the different power modules in an enclosure, care must be taken to ensure that the distance between the mounting positions of the PCB modules is large enough to allow PCB modules of different dimensions to be mounted next to each other on the host board. This may however lead to a lot of space in the enclosing of the electronic device being unused due to a too generously calculated spacing between the components. The amount of unused space in the housing increases the dimensions of the housing required for covering the plurality of PCB modules. In order to minimize the distance, which may also be referred to as a pitch, between the PCBs in systems, a low profile-height of the PCB module and an even, which may also be referred to as a uniform, skyline of the PCB module is usually desired. This however may lead to a limitation on the dimensions of the power components if the spacing between the components is inadequate.

SUMMARY

An object of embodiments herein is thus to provide a PCB module, which can be adapted to the available space and to the surrounding components in the enclosing of the electronic device. A further object of embodiments herein is to provide a method for adapting the PCB module in accordance to the available space.

According to a first aspect of embodiments herein the object is achieved by a Printed Circuit Board (PCB) comprising a through-hole for receiving a terminal. The through-hole penetrates one or more conductive layers of the PCB. The through-hole has a partially open side wall. The side wall is at least partially plated to electrically interconnect said one or more conductive layers. The side wall is open along at least a part of a length of the through-hole perpendicular to a radius of the through-hole. This allows the terminal to protrude through the open side wall, when received by the through-hole. Thereby, a position of the terminal is adjustable along the length of the open side wall.

According to a second aspect of embodiments herein the object is achieved by a terminal for mounting on the Printed Circuit Board (PCB). The terminal comprises a current conductive material, a base adapted to be received by the through-hole of the PCB and to create a press fit with the side wall of the through-hole and a pin projecting from a surface of the base. The pin is adapted to protrude through the open side wall, when the base is inserted into the through-hole of the PCB.

According to a third aspect the object is achieved by a method for assembling a PCB module, wherein the method comprises providing a PCB according to the first aspect of embodiments, inserting a terminal according to the second aspect of embodiments into the through-hole of the PCB and adjusting the position of the terminal in the through-hole in order to adapt a set of geometrical characteristics of the PCB module to a mounting position.

The embodiments herein introduce an efficient manner of enabling an adjustment of the position of the PCB module along an axis of the PCB module. By providing the PCB with a through-hole with an at least partially open side wall, the position of the PCB in relation to the terminal may be adapted by adjusting the position of the terminal within the through-hole. Since the terminal is the connection point to a second electrical component, such as e.g. a host board, the mounting position of the PCB module in relation to the host board and/or other components on the host board may also be adapted. Thereby larger components may be used at the PCB module than the conventional space, which may also be referred to as headroom, in the enclosing of the electronical device would allow. A denser blade pitch, i.e. the distance between the PCBs in the electronic device, may also be achieved which allows a higher number of PCB modules in a conventional enclosure or a reduction of the size of the enclosure for the same number of used PCB modules. Due to the adaptability of the position of the PCB in relation to the terminal, the position of the PCB may also be adapted to access cold wall under the host board, which improves the thermal distribution and thereby the cooling of the PCB module.

BRIEF DESCRIPTION OF THE DRAWINGS

Embodiments will now be described in more detail in relation to the enclosed drawings, in which.

DETAILED DESCRIPTION

Embodiments herein relate to a PCB, a terminal and a method for assembling a PCB module comprising the PCB and the terminal, in order to adapt a mounting position of the PCB module in relation to surrounding components, such as e.g. other PCB modules, a host board and/or a chassis of a surrounding enclosure.

Figure 1:
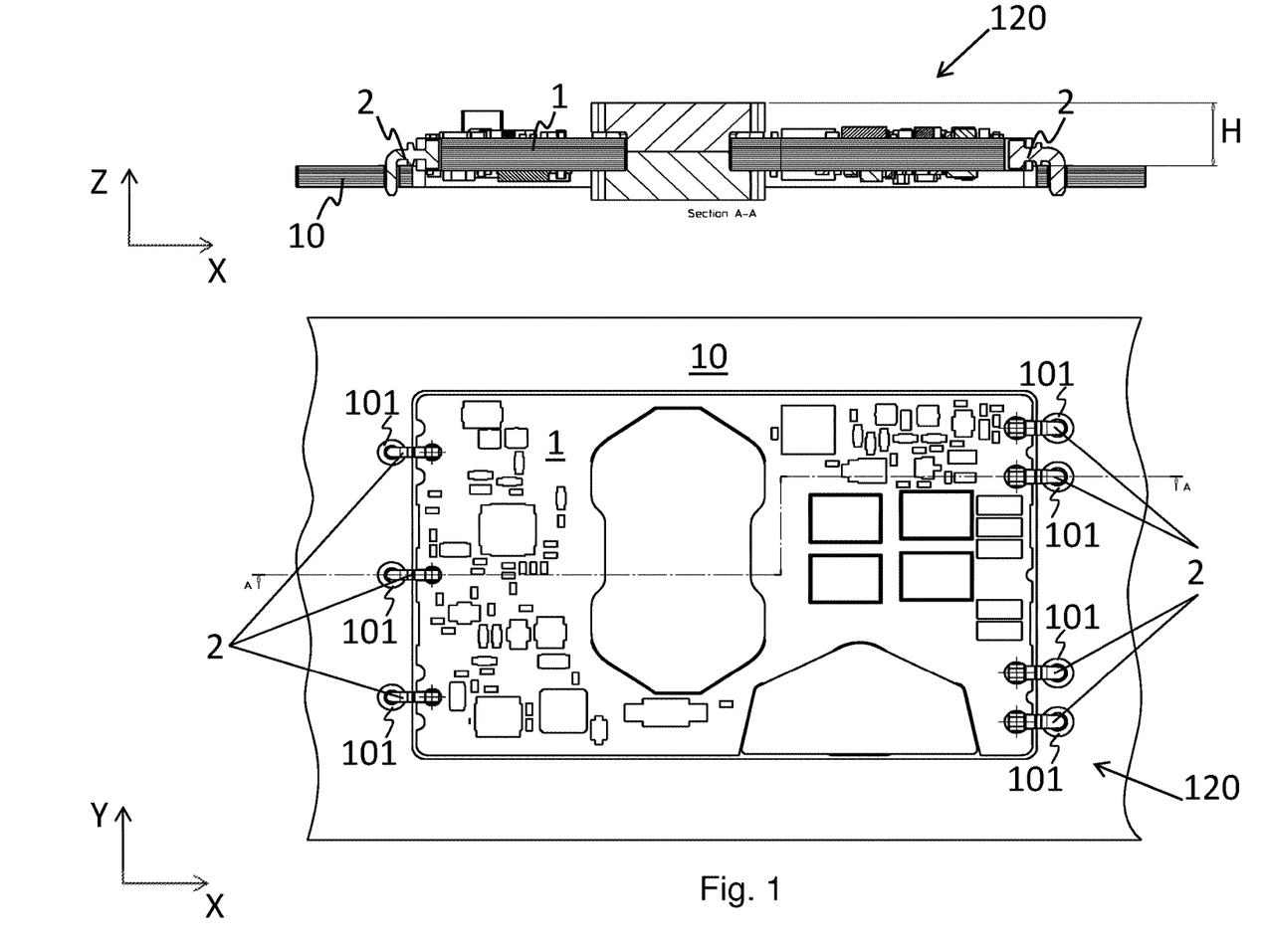
FIG. 1 illustrates a cross-section of a PCB module mounted on a host board according to a first embodiment herein.

Upper portion of FIG. 1 is a cross-sectional view along the section A-A of a PCB module 120, shown in the lower portion of FIG. 1, according to the embodiments herein, which PCB module 120 is mounted on a host board 10 in a lay down configuration. The host board 10 comprises a number of interconnection means 101 for receiving a pin 22 of the terminal 2, which number corresponds to the number of terminals 2 of the PCB module 120. The interconnection means 101 may e.g. be plated holes adapted to receive the pin 22. The extension of the PCB 1 and the host board 10 along an X-axis and a Y-axis define a plane of the PCB 1 and the host board 10, which herein is referred to as a main surface. The host board 10 further comprises a cut out in the main surface for receiving a PCB 1. As can be seen in FIG. 1, the PCB module 120 further comprises a plurality of power components located on the main surface of the PCB 1. The size of the power components determines the dimension of the PCB module 120 along a z-axis. The extension of the PCB module 120 along the Z-axis may herein be referred to as the height or the headroom of the PCB module 120. However due to the ability to adjust the position of the terminal 2 in the PCB 1 in relation to according to embodiments herein, the distance H of the PCB module 120 from a seating plane of the host board 10 may be adapted. This allows a usage of higher components on the PCB 1, i.e. components that have a larger dimension in the z-direction of the PCB 1, than a conventional building practice would allow.

Figure 2:
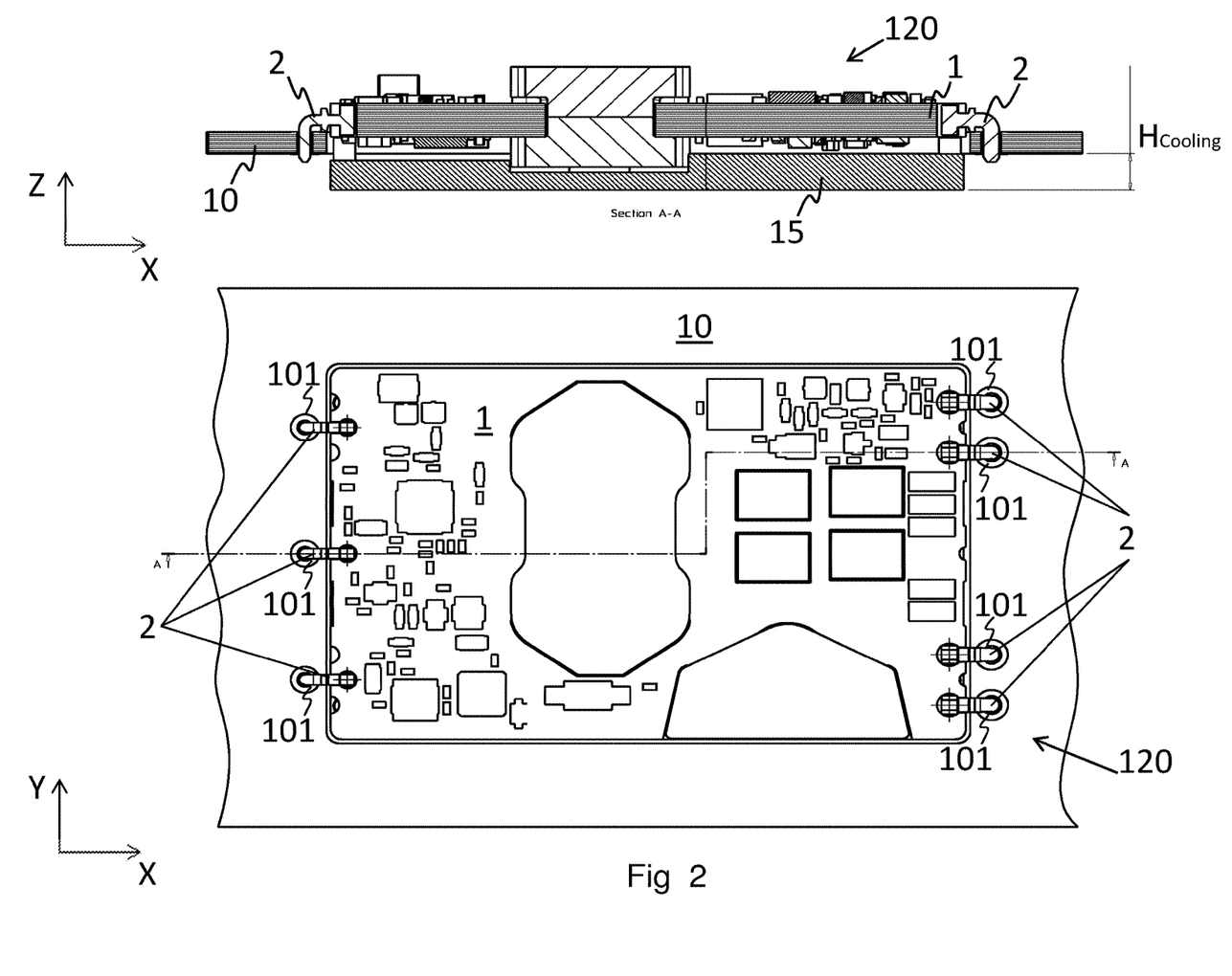
FIG. 2 illustrates a cross section PCB module mounted on a host board according to a second embodiment herein.

Upper portion of FIG. 2 is a cross-sectional view along the section A-A of a PCB module 120, shown in the lower portion of FIG. 2, according to a further embodiment herein. The PCB module 120 in FIG. 2 further comprises a base plate 15 made of a high thermo-conductive material, such as an aluminum plate or a heat sink, adapted to distribute thermal loss of the power components of the PCB module 120. In order to further increase the thermal loss distribution the base plate 15 may be brought into contact with a chassis of the enclosure, such as a e.g. a cold wall of the enclosure. However, due to the fact that different producers may have different tolerances when manufacturing components, the base plate 15 of a conventional PCB module 120 may not abut the chassis of the enclosure when the PCB module 120 is properly seated in the host board 10. Thereby, the thermal loss distribution may be reduced. This problem is however solved by the PCB module 120 disclosed in FIG. 2. Due to the ability to adjust the position of the PCB in relation to the terminal according to the embodiments herein, the distance $H_{Cooling}$ from a surface of the base plate 15 of the PCB module 120 to a seating plane of the host board 10 may be adapted. In this manner, the base plate 15 is positioned to correctly abut the chassis of the enclosure or any other area suitable for providing an increased cooling effect. Thus, the dissipated power can be transported to the bottom side of the PCB module which improves the cooling of the PCB module. Thereby, an optimal thermal resistance interface between hotspots of the PCB module 120 and the enclosure's chassis can be secured; in order to fit market demands of outdoor enclosures where cooling mechanisms are based mainly on conduction.

Figure 3:
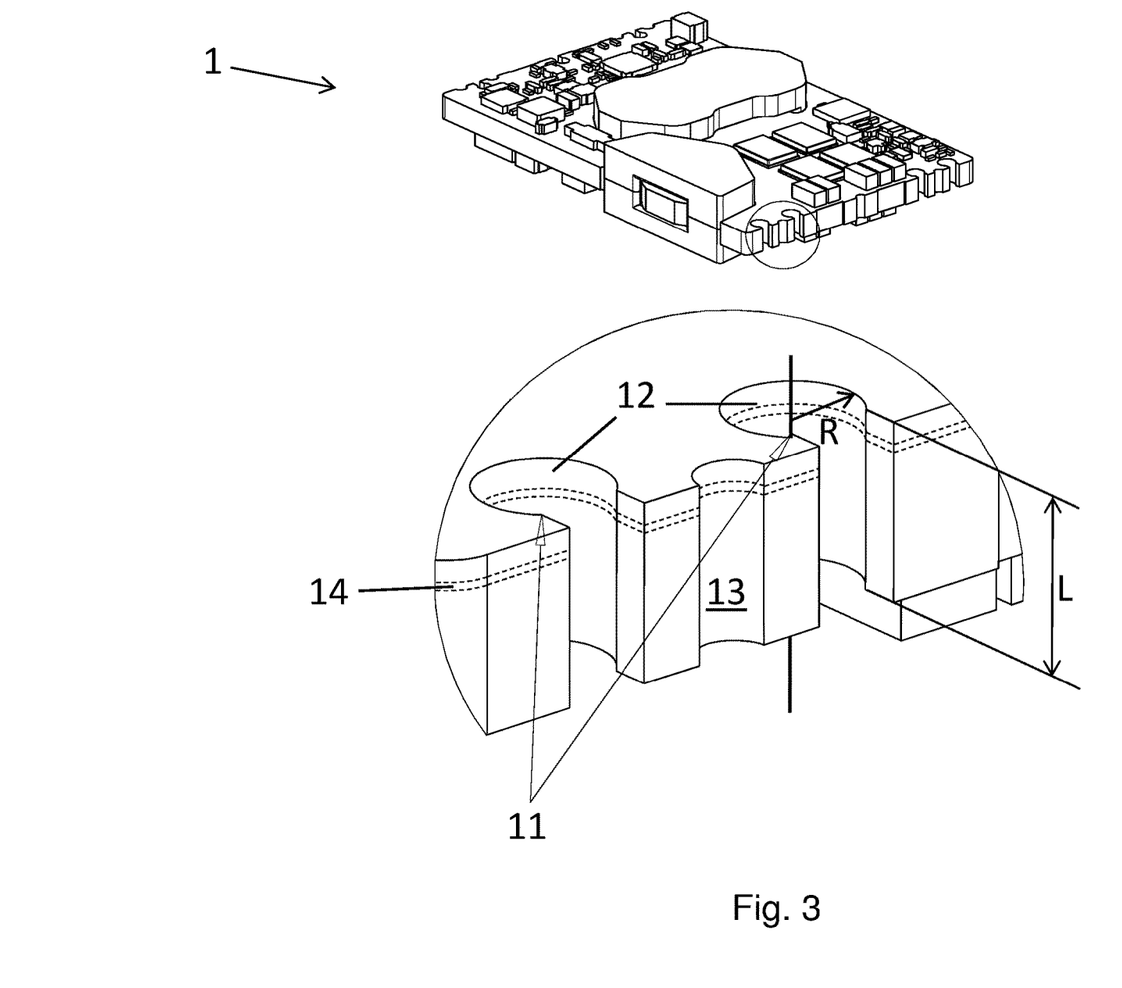
FIG. 3 illustrates a PCB in perspective according to some embodiments herein.

FIG. 3 discloses a Printed Circuit Board (PCB) 1 according to the embodiments herein. The PCB 1 comprises a through-hole 11 for receiving a terminal 2. The through-hole 11 penetrates one or more conductive layers 14 of the PCB 1. The through-hole 11 has a partially open side wall 12. The side wall 12 is at least partially plated to electrically interconnect the one or more conductive layers 14, which may comprise copper as a current conductive material. The side wall 12 is open along at least a part of a length L of the through-hole 11. The length L of the through-hole 11 extends in a longitudinal direction of the through-hole 11, perpendicular to a radius R of the through-hole 11 for allowing the terminal 2 to protrude through the open side wall 12 when received by the through-hole 11. The longitudinal direction may also be referred to as the direction of the lengthwise extension of a body, such as e.g. the PCB 1 and/or the terminal 2. A width of the opening of the side wall 12 is adapted to allow the terminal 2 to protrude through the open side wall 12. A minimum width however corresponds to the dimension of the terminal 2 in the section of the terminal protruding through the open side wall 12. This dimension of the terminal 2 may e.g. be the diameter of a pin 22. The open side wall 12 allows the position of the terminal 2 in the through-hole 11 to be adjusted along the length L of the through-hole 11.

In some embodiments herein, the side wall 12 may be open along the entire length L of the through-hole 11. The length L extends perpendicular to the radius R of the through-hole 11. By allowing the open side wall 12 to be open along the entire length L of the through-hole 11, an adjustment possibility of the terminal's 2 position within the through-hole 11 is increased. The radius of the through-hole 11 is adapted to the size of a base 23 of the terminal 2, such that the side wall 12 of the through-hole 11 creates a press fit with a plurality of edges 25 of the base 23 of the terminal 2.

By securing alternative placements of the terminals 2 within an acceptable range along the length of the through-hole 11, which length is determined by a thickness, i.e. in the z-direction according to FIG. 1 and FIG. 2, of the PCB 1, a different set of geometrical characteristics may be achieved resulting in a flexible and/or adjustable placement of the PCB module 120, which can be used to increase the thermal loss or to accommodate for a desired skyline of the PCB module 120.

Figure 4:
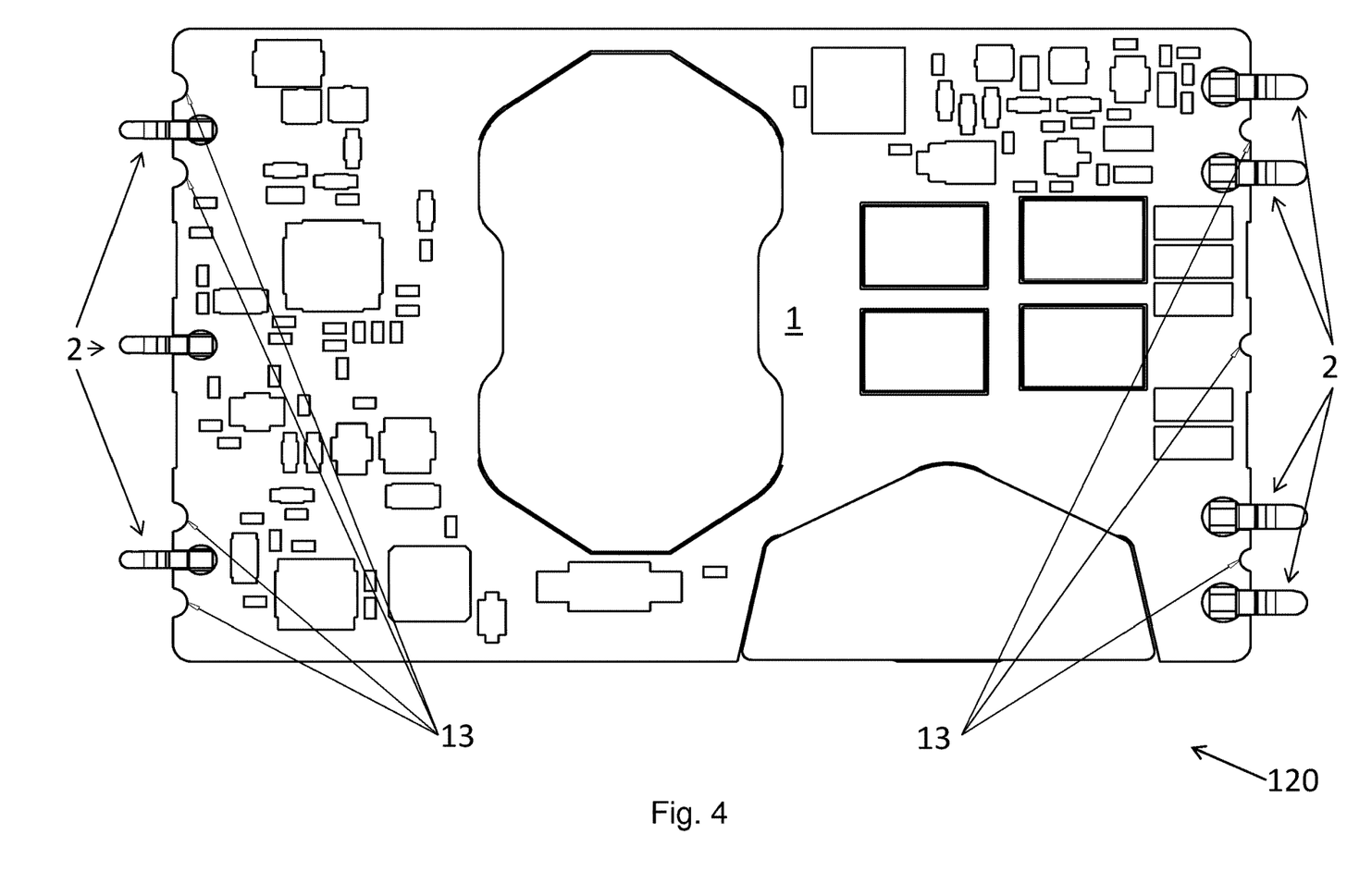
FIG. 4 illustrates a PCB module from above according to some embodiments herein.

The PCB 1 may further comprise one or more grooves 13 located on an edge of the PCB 1, as disclosed in FIG. 4. The grooves 13, located on a first edge of the PCB 1, may correspond to a pattern of the through-holes 11 located on a second edge of the PCB 1, located oppositely to said first edge of the PCB 1. The one or more grooves 13 are adapted to guide one or more terminals of a second PCB 1', in order to correctly position the terminals of the second PCB 1' in relation to the second PCB 1' during production of the PCBs 1, 1'. During production, the PCBs 1, 1' may be mounted next to each other in a production array, in order to insert terminals 2 into the through holes 11 of the PCBs 1, 1'.

Figure 5:
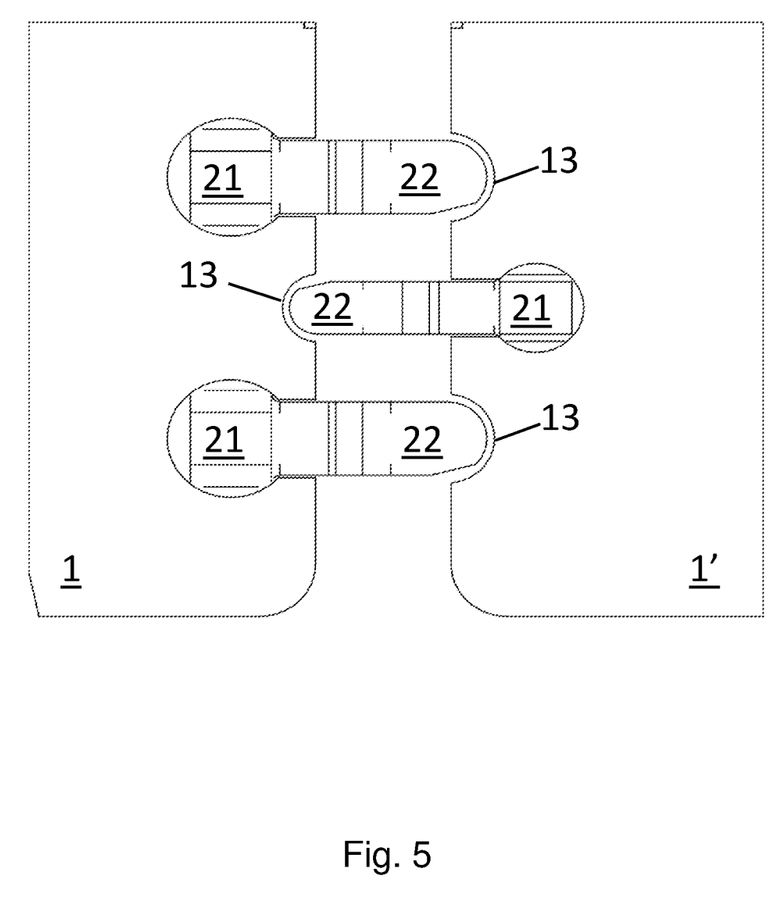
FIG. 5 illustrates two PCB modules from above during assembly according to some embodiments herein.

FIG. 5 discloses the first PCB 1 and the second PCB 1' mounted in the production array, the production array itself is however not shown. The base 23 of the terminals 2 of the PCB 1 are positioned above the through-holes 11 of the PCB 1, the opposite end of the terminal 2, i.e. the free end of the pin 22, is guided by the grooves 13 in the second PCB 1'. This ensures a correct seating of the terminal 2 in the through-hole 11, when the terminal is pressed into the PCB 1. Correspondingly, the same applies for the second PCB 1'. The geometric shape of the grooves in the PCB 1 as well as the geometric shape of the production array is designed to meet the position tolerances of the pins 22, required for allowing the pins 22 to connect to the interconnection means 101, and the dimensions of the PCB module 120. The geometric shape may also be referred to as a curvature profile. The production array may e.g. be a mounting press-fixture which allows the PCB 1 to be held in place while the terminals 2 are pressed into the through holes 11 of the PCB 1.

Figure 6A:
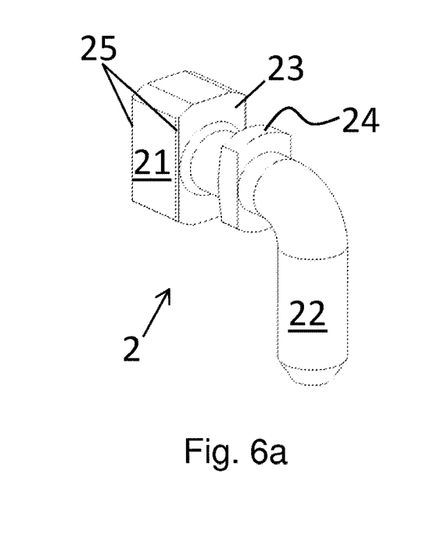
FIG. 6a-c illustrates a terminal in perspective view according to three different embodiments herein.
Figure 6B:
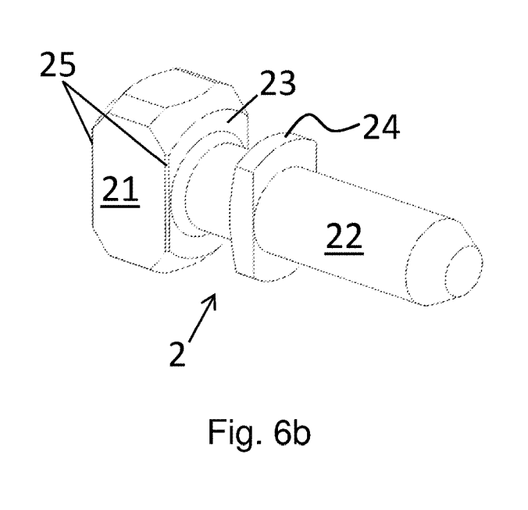
Figure 6C:
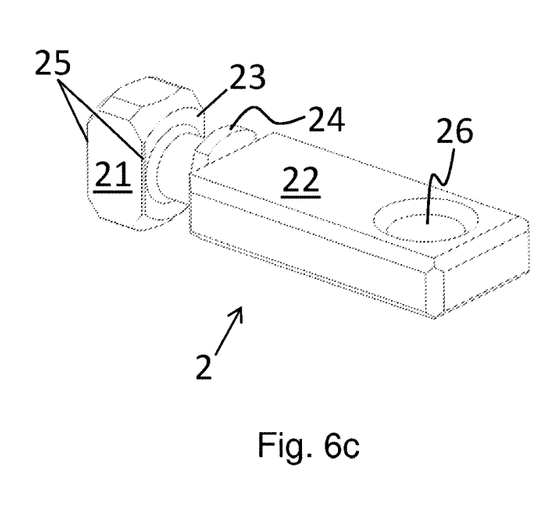

FIG. 6a-c disclose a terminal 2 for the PCB 1, according to different embodiments herein. The terminal 2 comprises a current conductive material, such as copper. The terminal comprises a base 21 which is adapted to be received by the through-hole 11 of the PCB 1 and to create a press fit with the side wall 12 of the through-hole 11. The terminal 2 further comprises a pin 22 projecting from a surface 23 of the base 21, which surface 23 is parallel to the insertion direction of the base 21 in the through hole 11. The pin 22 is adapted to protrude through the open side wall 12, when the base 21 of the terminal 2 is inserted into the at least partially plated through-hole 11 of the PCB 1.

The pin 22 of the terminal 2 may further comprise a collar 24 extending in a radial direction of the pin 22. The collar 24 is adapted to provide a spacing, which may also be referred to as a stand-off, to an electrical component adapted to receive the pin 22, such as e.g. the host board 10. A seating plane of the PCB may be defined by means of the design of the collar 24. In order to increase the spacing between the PCB and the electrical component adapted to receive the pin 22, the radial extension of the collar 24 may be increased. In some embodiments herein, the terminal may be adapted to be soldered to the side wall 12 of the through-hole in order to provide an improved electrical interconnection between the PCB 1 and the terminal 2. Thereby, a low-ohmic current distribution across the PCB module 120 can be achieved. In some embodiments herein the terminal 2 may comprise 100% copper which further improves the electrical interconnection of the host board 10 and the conductive layers of the PCB 1 via the terminal 2. The collar 24 may further be adapted to prevent solder from wetting out along the pin 22 when the terminal 2 is soldered to the side walls 12 of the through-hole 11 of the PCB 1, i.e. the collar 24 will provide a stop functionality for the solder. Thereby, the soldering of the terminal 2 may be performed in a more accurate and/or reliable manner, which further improves the electrical interconnection between the PCB 1 and the terminal 2. The open side wall 12 in conjunction with the collar 24 further improves the possibility to visually inspect a solder joint of the terminal 2, in order to assess the quality, e.g. in terms of reliability, of the solder joint. An extension h of the collar 24 in the radial direction may further be adapted to provide a required spacing of the PCB 1 to the electrical component adapted to receive the pin 22, such as e.g. the host board 10. This embodiment may e.g. be used when the PCB is mounted to the host board 10 in a lay down configuration. The position of the collar 24 on the pin 22 may in some embodiments also be adapted to provide the required spacing between the PCB 1 to the electrical component adapted to receive the pin 22. This embodiment may e.g. be used when the PCB is mounted to the host board 10 in a Single In line Package (SIP) configuration. The collar 24 may comprise a partly circular shape, wherein the redius of the partly circular shape defines the extension h of the collar 24.

The base 21 of the terminal 2 may be mainly prism-shaped, i.e. having two parallel faces connected by a plurality of other faces creating a parallelogram. The connection point of two faces of the prism shape create an edge 25 of the base 21 of the terminal 2. A plurality of edges 25 of the prism-shaped base 21 are configured to create the press fit with the side wall 12 of the through-hole 11. As long as at least a part of the edges 25 are in connection with the through-hole 11 of the PCB 1, the position of the terminal can be chosen freely along the length of the open side wall 12.

In a first embodiment of the terminal 2, which embodiment is disclosed in FIG. 6a, the terminal 2 is adapted for a lay down configuration of the PCB module 120 on the host board 10. In this embodiment the pin 22 has a right angled extension in a longitudinal direction of the pin 22, thereby allowing the PCB 1 to be mounted with a lay down design. In the lay down configuration a main extension plane of the PCB is mounted in parallel to a main extension plane of the host board 10.

In a further embodiment of the terminal 2, which embodiment is disclosed in FIG. 6b, the terminal 2 is adapted for a SIP configuration of the PCB module 120 on the host board 10. In this embodiment the pin 22 has a straight extension in a longitudinal direction of the pin 22, thereby allowing the PCB 1 to be mounted as a SIP. In the SIP configuration, the main surface of the PCB 1 is mounted perpendicular to the main extension plane of the host board 10. The SIP configuration has the benefit that the length of the pin 2 can be very short, since the distance between the PCB module and the host board is reduced.

In a further embodiment of the terminal 2, which embodiment is disclosed in FIG. 6c, the terminal 2 is adpated for being connected to an electrical component, such as the host board 10, by a screw type connection. In this embodiment the pin 22 comprises a through-hole 26 adapted to receive a screw for connecting the pin 22 to the electrical component receiving the pin 22.

Figure 7:
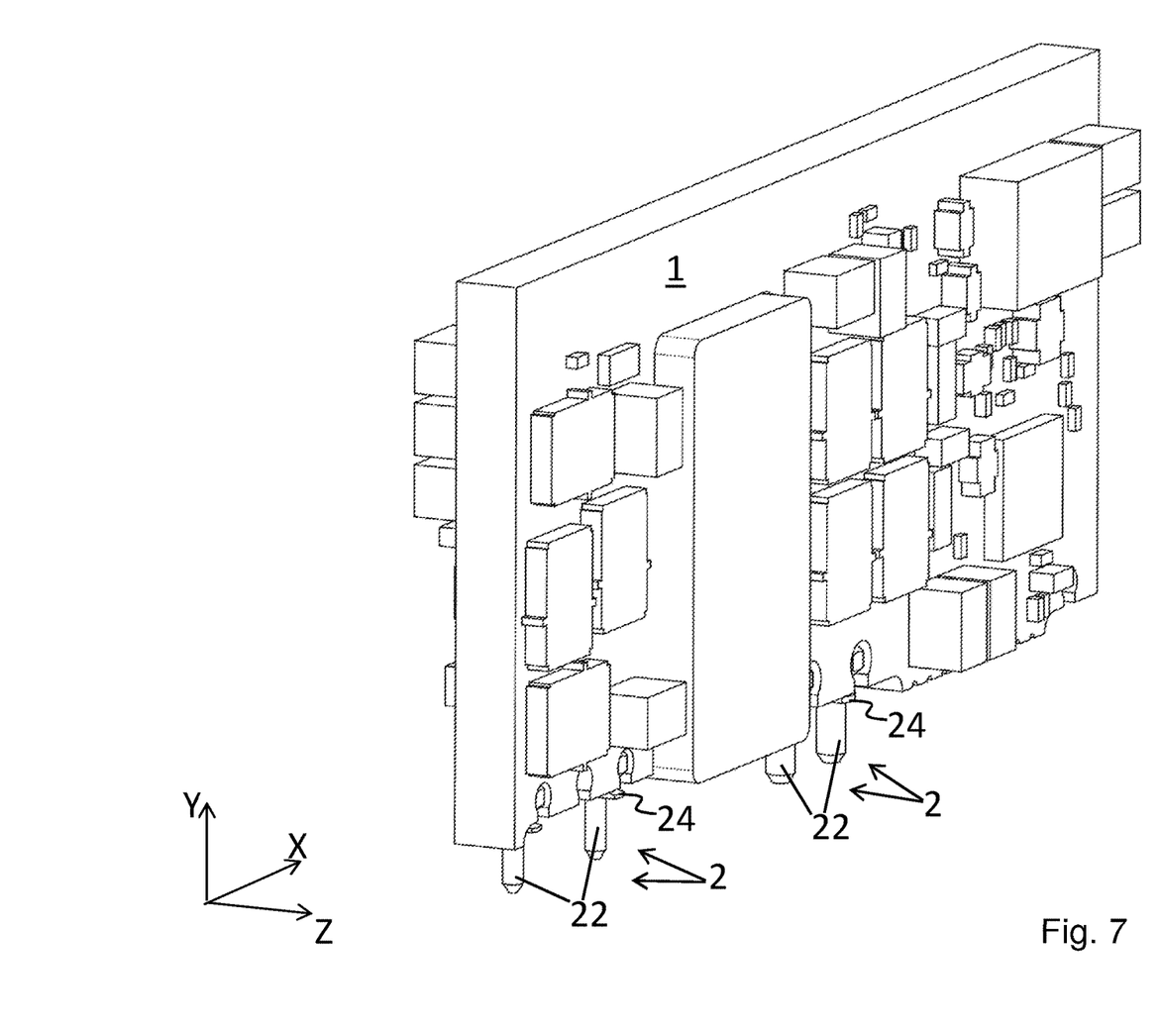
FIG. 7 illustrates a PCB module for SIP configuration in perspective view according to some embodiments herein.

FIG. 7 discloses the PCB module 120 for mounting on a host board 10 in a SIP configuration. The terminals 2 comprise a pin 22 configuration according to the embodiment described in FIG. 6b, i.e. having a straight extension in a longitudinal direction of the pin 22. When the pins 22 are inserted into the interconnection means 101 of the host board 10, the main surface of the PCB 1 which extends in the X-Y-plane of the PCB, is positioned perpendicularly to the main surface of the host board 10. By adjusting the position of the terminal 2 along the length of the through-hole 11 of the PCB 1, the position of the PCB in relation to the interconnection means 101 of the host board 10 may be adapted in the Z-direction of the PCB 1. Thereby, the distance to a second PCB 1' mounted in the SIP configuration next to the PCB 1 may be adapted in order to use the space between the PCBs 1, 1' in a more efficient manner. The position of the PCB 1 may also be adjusted along the Z-axis in such a way that the PCB 1 is brought into contact with a cooling surface of the chassis of the enclosure, in order to improve the thermal loss distribution of the PCB 1. By further adapting the position of the collar 24 on the pins 22 along a longitudinal direction of the pins 22, the seating height of the PCB 1, i.e. the distance from the PCB 1 to the host board 10, can be adjusted.

Figure 8:
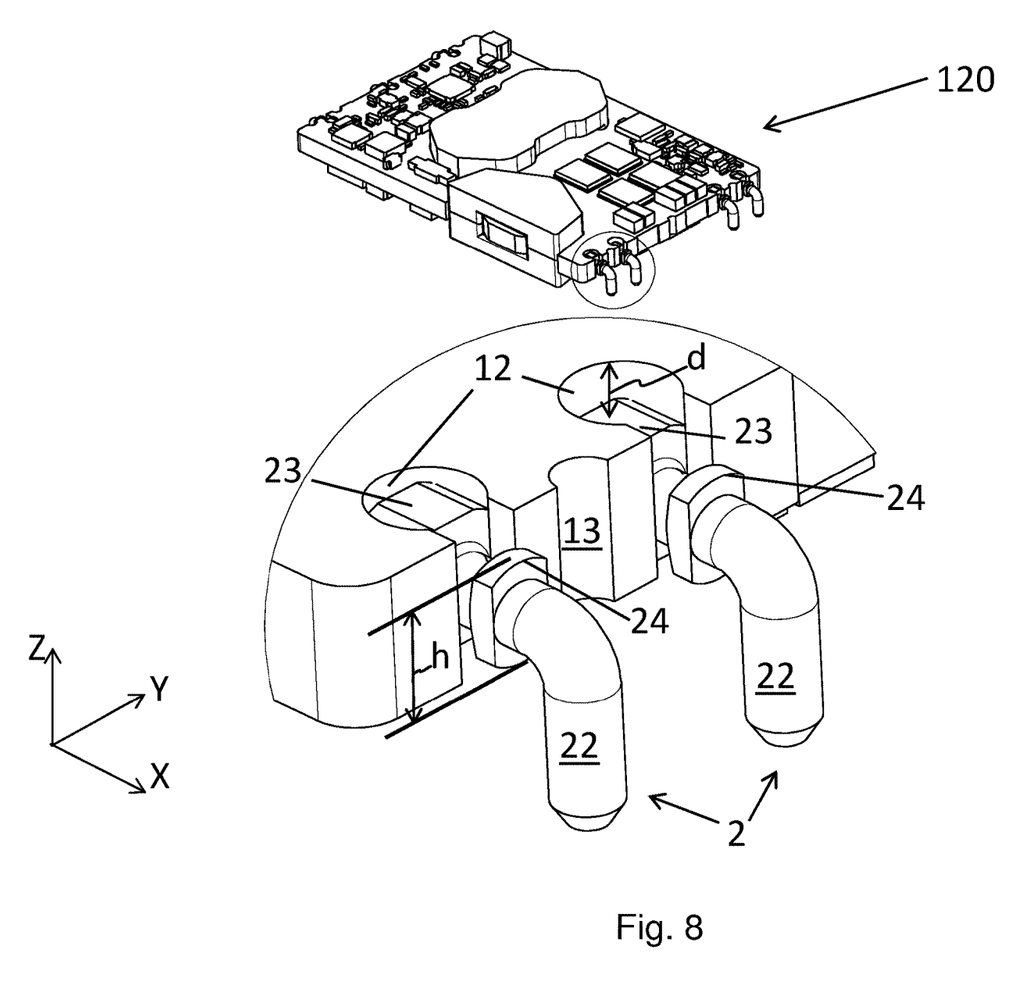
FIG. 8 illustrates a PCB module for lay down configuration in perspective view according to some embodiments herein.

FIG. 8 discloses the PCB module 120 for mounting on a host board 10 in a lay down configuration. The terminals 2 comprise a pin 22 configuration according to the embodiment described in FIG. 6a, i.e. the pins having a right angled extension in the longitudinal direction of the pin 22. When the pins 22 are inserted into the interconnection means 101 of the host board 10, which host board 10 is not shown in FIG. 8, the main extension plane of the PCB which extends in the X-Y-direction of the PCB 1, is positioned parallel to the main extension plane of the host board 10 extending in the X-Y-direction of the host board 10. By adjusting the position of the terminal 2 along the length of the through-hole 11 of the PCB 1, i.e. by adapting the distance d from the base 23 of the terminal to the surface of the PCB 1, the position of the PCB 1 in relation to the interconnection means 101 of the host board 10 may be adapted in the Z-direction of the PCB 1. Thereby, the height of the PCB module 120 may be adapted in order to use the space in the enclosure in a more efficient manner and/or the cooling height of the base plate 15 may be adjusted along the Z-axis in such a way that the PCB 1 or the base plate 15 is brought into contact with a cooling surface of the chassis of the enclosure, in order to improve the thermal loss distribution of the PCB 1. By further adjusting the height h of the collar 24, i.e. the radial extension of the collar 24, a seating plane of the PCB 1, i.e. the distance from the PCB 1 to the host board 10, can be defined.

Figure 9:
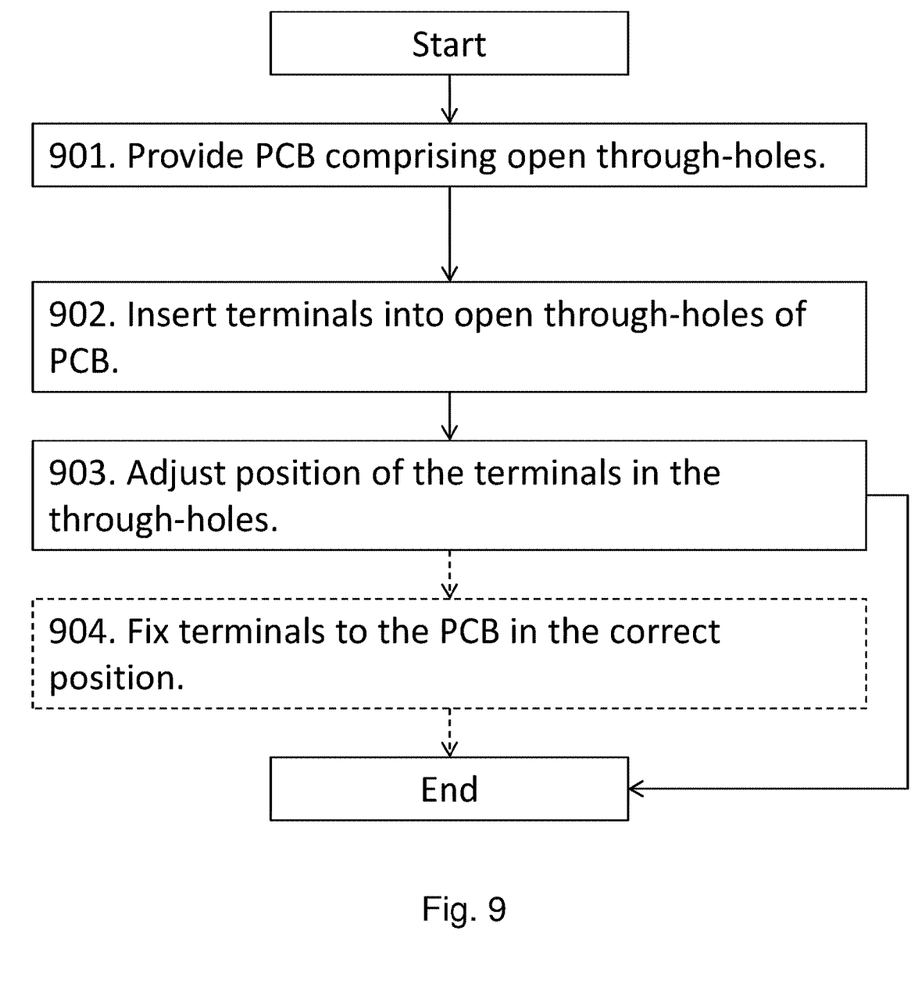
FIG. 9 is a schematic flowchart depicting a method for assembling a PCB module.

An exemplifying method for assembling a PCB module 120 according to embodiments herein will now be described with reference to a flowchart depicted in FIG. 9. The following actions do not have to be taken in the order stated below, but may be taken in any suitable order. Actions performed in only some embodiments are marked with dashed boxes.

Action 901. A PCB 1 according to one of the embodiments herein is provided. The PCB 1 may be provided in a production array, which production array is a fixture for holding the PCB 1 in place during assembly.

Action 902. A terminal 2 according to one of the embodiments herein is inserted into the through-hole 11 of the PCB 1. The terminal 2 may be inserted into the through-hole 11 by first positioning the base 23 of the terminal 2 above the through-hole 11 of the PCB 1 using a pin insertion fixture and then pressing the base 23 of the terminal 2 into the through-hole 11 using a pressing tool. The pressing tool may also be referred to as a hammer. The insertion of the terminal 2 into the through-hole of the PCB 1 may be performed in a production line in a production facility before the PCB module 120 is delievered to an end user. The insertion may however also be performed by the end user upon assembly of an electronic device. The terminal 2 may be selected from anyone of the embodiments described in FIG. 6. Thereby, the seating plane of the PCB module can be defined in the assembly process.

Action 903. The position of the terminal 2 in the through-hole 11 is adjusted in order to adapt a set of geometrical characteristics of the PCB module 120 to a mounting position. The PCB module may e.g. be mounted inside an enclosure of an electronic device. The set of geometrical characteristics may comprise a height of the PCB module 120 and/or a seating height of the PCB module 120 in relation to a host board 10 and/or a cooling height of the PCB module 120 in relation to a the host board 10 and/or a casing, which herein is also referred to as an enclosure, in which the PCB module 120 is mounted. The height of the PCB module 120 may depend on the dimensions of components, such as power components, mounted on the PCB 1 and extending in an Z-direction of the PCB module 120. The adjusting of the position of the terminal 2 may e.g. be performed by test fitting the PCB module 120 on the host board 10 by connecting the pin 22 of the terminal 2 to an interconnection means 101 of the host board 10, and thereafter changing the distance d from the base 23 of the terminal 2 to the surface of the PCB 1 in order to adapt the position of the PCB in relation to other components, such as e.g. the host board 10, other PCB modules 1' or components mounted on the host board 10 and/or a chassis of an enclosure enclosing the PCB module 1. The distance d may e.g. be changed pressing either on the terminal 2 or on the PCB 1, using a pressing tool. The adjustment of the position of the terminal 2 in the through-hole 11 may preferably be performed upon assembly of an electronic device comprising the PCB module 120. Thereby, a PCB module 120 with an adjustable and flexible seating height and/or cooling height is provided in order to fulfill the requirements regarding spacing and thermal management of the PCB.

Action 904. In a further embodiment herein the terminal 2 may be fixed to the PCB 1, when the terminal 2 has been adjusted to a correct position, which is a position in which the thermal loss and/or the accomodation for a desired skyline of the PCB module 1 is increased, in the through-hole 11. The fixing of the terminal 2 may e.g. be performed by soldering the terminal to the plated inner wall 12 of the PCB 1. Thereby, an improved electrical connection between the PCB 1 and the terminal 2 is created, which reduces the electrical resistance between the PCB 1 and the terminal 2. This connection may also be referred to as a low-ohmic electrical connection.

Figure 10:
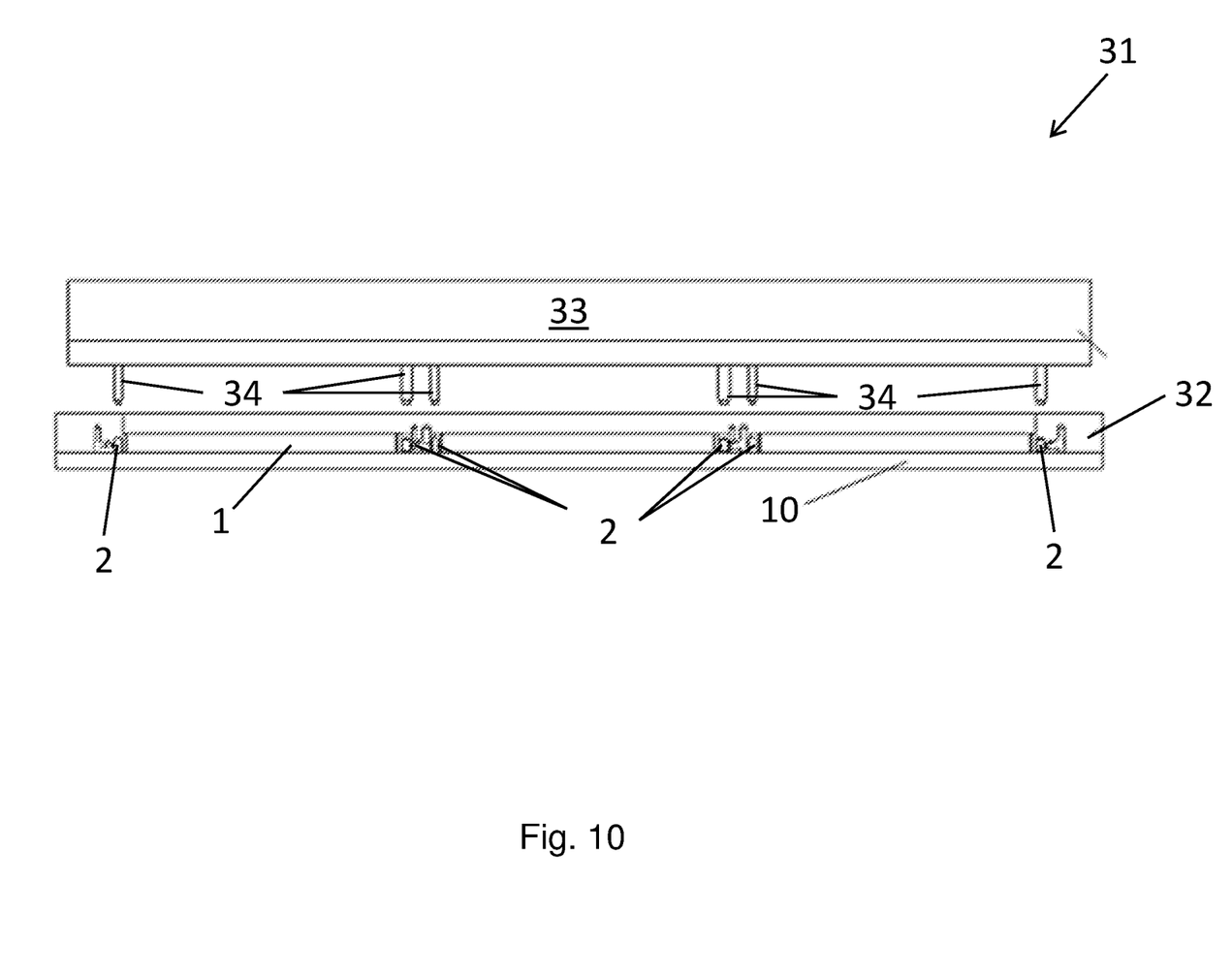
FIG. 10 illustrates an assembly tool for assembling a PCB module from the side according to some embodiments herein.

FIG. 10 discloses an assembling tool 31 for assembling the PCB module 120. The assembling tool 31 comprises a fixture 32 for holding the PCB 1 into position while pressing the terminals 2 into the through-holes 11 and a pressing tool 33, which may also be referred to as a hammer. The pressing tool 33 comprises pins 34 configured to contact the base 23 of the terminals 2 and to transfer a force created by the pressing tool 33 onto the base 23 of the terminal 2 thereby pressing the terminal into the receiving through-hole 11 of the PCB 1.

Figure 11:
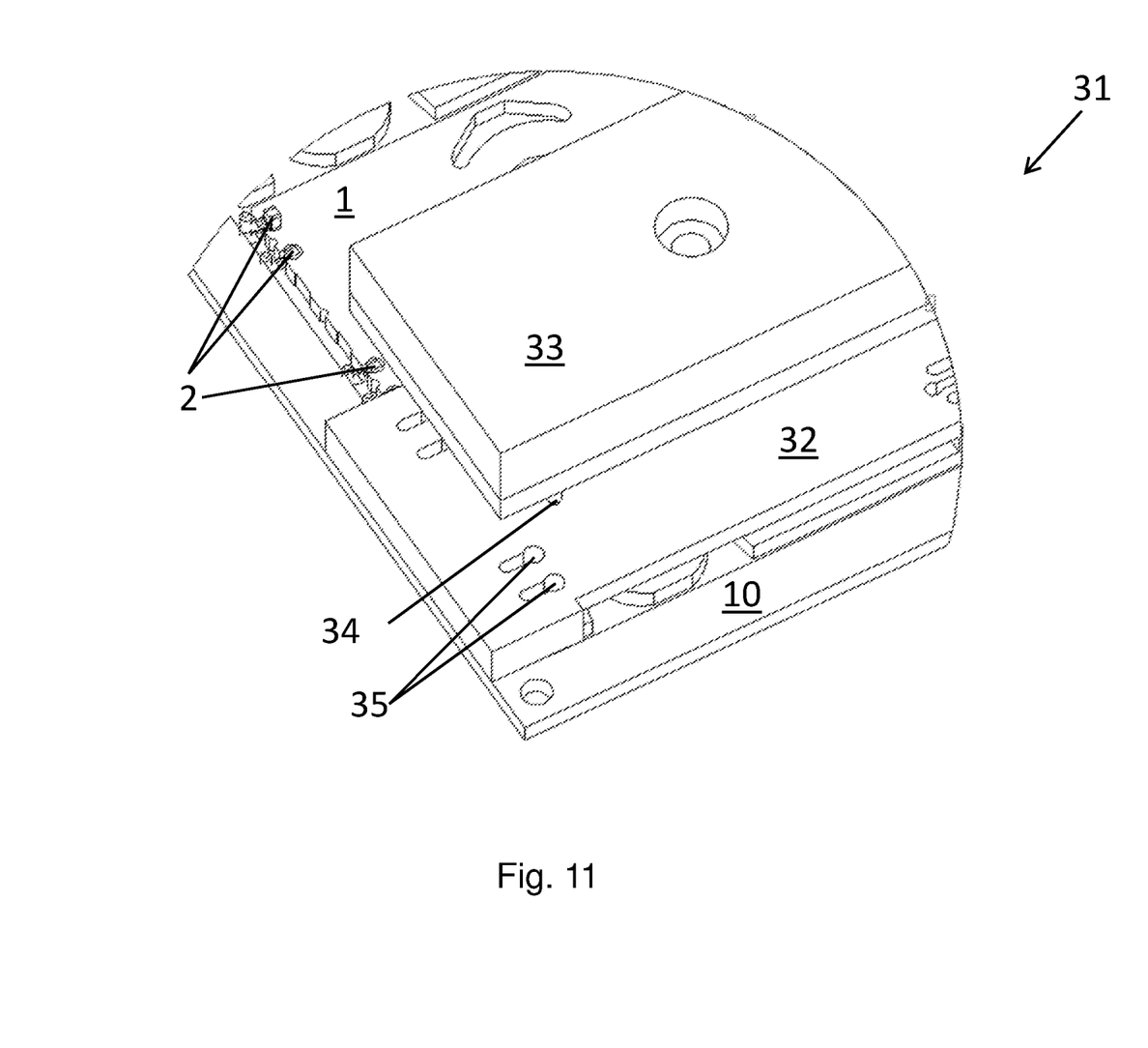
FIG. 11 illustrates an assembly tool for assembling a PCB module in perspective view according to some embodiments herein.

As can be seen in FIG. 11, the fixture 32 is positioned on top of the PCB 1 positioned on a host board 10 and comprises elongated through-holes 35 for guiding the terminals in relation to the PCB 1. The form of the elongated through holes 35 corresponds to the outline of the terminals 2, further the pattern of the through holes 35 corresponds to the pattern of the through-holes 11 of the PCB 1. Thereby, the terminals 2 can be placed in the elongated through-holes 35, wherein the elongated through-holes 35 position the terminals 2 correctly in relation to the through-holes 11 in the PCB 1. When the pressing tool 33 is applied to press the terminals into the through-holes 11, the pins 34 of the pressing tool 33 penetrate the through-holes 35 in order to contact the base of the terminal 2. The assembling tool allows an end user to adjust the positioning of the PCB module 120 in order to overcome the product height constraints created by other components surrounding the PCB module 120.

It will be appreciated that the foregoing description and the accompanying drawings represent non-limiting examples of the methods and apparatus taught herein. As such, the apparatus and techniques taught herein are not limited by the foregoing description and accompanying drawings. Instead, the embodiments herein are limited only by the following claims and their legal equivalents.

The invention claimed is:

1. A Printed Circuit Board, PCB, comprising one or more through-holes for receiving one or more terminals, wherein the one or more through-holes penetrates one or more conductive layers of the PCB and the one or more through-holes has a partially open side wall,
   wherein the side wall is at least partially plated to electrically interconnect said one or more conductive layers and wherein the side wall is open along at least a part of a length of the one or more through holes perpendicular to a radius of the one or more through-holes for allowing the terminal to protrude through the open side wall when received by the one or more through-holes, such that a position of the terminal is adjustable along the length of the open side wall, and
   wherein the PCB comprises one or more grooves located in between the one or more through-holes on an edge of the PCB adapted to guide the one or more terminals of another PCB positioned next to the PCB, in order to position a terminal of the another PCB in relation to the PCB.

2. The PCB of claim 1, wherein the side wall is open along an entirety of the length of the one or more through-holes perpendicular to the radius of the one or more through-holes.

3. A terminal for mounting on a printed circuit board (PCB) comprising one or more through-holes that penetrates one or more conductive layers of the PCB,
   wherein the one or more through-holes has a partially open side wall that is at least partially plated to electrically interconnect said one or more conductive layers, and the side wall is open along at least a part of a length of the one or more through-holes perpendicular to a radius of the one or more through-holes for allowing the terminal to protrude through the open side wall when received by the one or more through-holes such that a position of the terminal is adjustable along the length of the open side wall, the terminal comprising:
   a current conductive material;
   a base adapted to be received by the one or more through-holes of the PCB and to create a press fit with the side wall of the one or more through-holes; and
   a pin projecting from a surface of the base, wherein the pin is adapted to protrude through the open side wall when the base is inserted into the one or more through-holes of the PCB,
   wherein the pin further comprises a collar extending in a radial direction of the pin, and
   wherein the collar is adapted to provide a spacing to an electrical component adapted to receive the pin.

4. The terminal of claim 3, wherein the terminal is further adapted to be soldered to the side wall of the one or more through-holes, and wherein the collar further is adapted to prevent solder from wetting out along the pin when the terminal is soldered to the PCB.

5. The terminal of claim 3, wherein an extension of the collar in the radial direction is adapted to a required spacing of the PCB with respect to the electrical component adapted to receive the pin.

6. The terminal of claim 3, wherein a position of the collar on the pin is adapted to a/the required spacing of the PCB to the electrical component adapted to receive the pin.

7. The terminal of claim 4, wherein the base of the terminal is mainly prism-shaped and wherein a plurality of edges of the prism-shaped base create the press fit with the side wall of the one or more through-holes.

8. The terminal of claim 3, wherein the pin has a right angled extension in a longitudinal direction of the pin thereby allowing the PCB to be mounted with a lay down design.

9. The terminal of claim 3, wherein the pin has a straight extension in a longitudinal direction of the pin, thereby allowing the PCB to be mounted as a single in one package.

10. The terminal of claim 3, wherein the pin comprises another through-hole adapted to receive a screw for connecting the pin to an electrical component receiving the pin.

11. A method for assembling a printed circuit board (PCB) module, the method comprising:
    obtaining a PCB, wherein the PCB comprises one or more through-holes that penetrates one or more conductive layers of the PCB,
       wherein the one or more through-holes has a partially open side wall that is at least partially plated to electrically interconnect said one or more conductive layers, and the side wall is open along at least a part of a length of the one or more through-holes perpendicular to a radius of the one or more through-holes for allowing the terminal to protrude through the open side wall when received by the one or more through-holes such that a position of the terminal is adjustable along the length of the open side wall,
       wherein the PCB comprises one or more grooves located in between the one or more through-holes on an edge of the PCB adapted to guide one or more terminals of another PCB positioned next to the PCB, in order to position a terminal of the another PCB in relation to the PCB;
    inserting a terminal into the one or more through-holes of the PCB,
    adjusting a position of the terminal in the one or more through-holes in order to adapt a set of geometrical characteristics of the PCB module to a mounting position.

12. The method of claim 11, wherein the method further comprises:
    fixing the terminal to the PCB in a position by soldering.

13. The method of claim 11, wherein the set of geometrical characteristics comprises a height of the PCB module, and/or a seating height of the PCB module in relation to a host board and/or a cooling height of the PCB module in relation to a host board and/or a casing in which the PCB module is mounted.

14. The method of claim 11, wherein the terminal comprises:
- a current conductive material;
- a base adapted to be received by the one or more through-holes of the PCB and to create a press fit with the side wall of the one or more through-holes; and
- a pin projecting from a surface of the base, wherein the pin is adapted to protrude through the open side wall when the base is inserted into the one or more through-holes of the PCB.

15. The method of claim 14, wherein inserting the terminal into the one or more through-holes of the PCB comprises inserting the base into the one or more through-holes of the PCB such that the pin protrudes through the open side wall.

* * * * *